United States Patent [19]
Fuchs

[11] Patent Number: 5,897,756
[45] Date of Patent: Apr. 27, 1999

[54] DEVICE FOR CHEMICAL OR ELECTROYLTIC SURFACE TREATMENT OF PLATE-LIKE OBJECTS

[75] Inventor: Karl Hans Fuchs, Ditzingen, Germany

[73] Assignee: Lea Ronal GmbH, Birkenfeld, Germany

[21] Appl. No.: 08/860,448

[22] PCT Filed: Oct. 11, 1996

[86] PCT No.: PCT/DE96/01938

§ 371 Date: Jun. 26, 1997

§ 102(e) Date: Jun. 26, 1997

[87] PCT Pub. No.: WO97/15702

PCT Pub. Date: May 1, 1997

[30] Foreign Application Priority Data

Oct. 26, 1995 [DE] Germany ............ 195 39 866
Nov. 6, 1995 [DE] Germany ............ 195 41 099

[51] Int. Cl.$^6$ ............ C25D 17/00; B05C 3/00
[52] U.S. Cl. ............ 204/273; 204/277; 118/429
[58] Field of Search ............ 118/429; 204/275–278, 204/273

[56] References Cited

U.S. PATENT DOCUMENTS

| | | | |
|---|---|---|---|
| 3,875,041 | 4/1975 | Harvey et al. | 204/277 X |
| 3,959,112 | 5/1976 | Arend, Jr. | 204/273 |
| 4,113,586 | 9/1978 | Cook et al. | 204/277 X |
| 4,773,983 | 9/1988 | Shyu . | |
| 5,139,636 | 8/1992 | Sawa et al. | 204/273 |

FOREIGN PATENT DOCUMENTS

| | | |
|---|---|---|
| 0 420 640 A1 | 4/1991 | European Pat. Off. . |
| 0 481 576 A2 | 4/1992 | European Pat. Off. . |
| 39 29 728 A1 | 3/1991 | Germany . |
| 44 05 741 C1 | 6/1995 | Germany . |
| 285 127 B5 | 11/1995 | Germany . |
| WO 96/15294 | 5/1996 | WIPO . |

OTHER PUBLICATIONS

"Electroplating Cell for Plating Vias", Bissinger, IBM Technical Disclosure Bulletin, vol. 25, No. 12, May 1983, pp. 6566–6568.

Primary Examiner—Donald R. Valentine
Attorney, Agent, or Firm—Pillsbury Madison & Sutro

[57] ABSTRACT

A device in the form of a flow cell for the chemical or electrolytic surface treatment of plate-shaped articles has first feed elements in the form of tubes with outlet openings for the directed supply of a process liquid to the articles to be treated and, in accordance with the invention, additional, second feed means in the process liquid for the directed introduction of air into the active area of guide elements, which consist of flow gratings, maintained at a distance on both sides of the articles to be treated, with small plates arranged in the manner of a shutter, which are inclined upward and downward in the direction parallel with the main plane of the flat plate articles.

This principle of admixing air in connection with the design of the guide elements as flow gratings has the effect that the emerging air bubbles pass the flow gratings in an upward direction and carry the surrounding process liquid along. The relationship between the outlay for the forced guidance of the process liquid for optimizing the process parameters and the outlay of energy required for this is decisively improved.

14 Claims, 2 Drawing Sheets

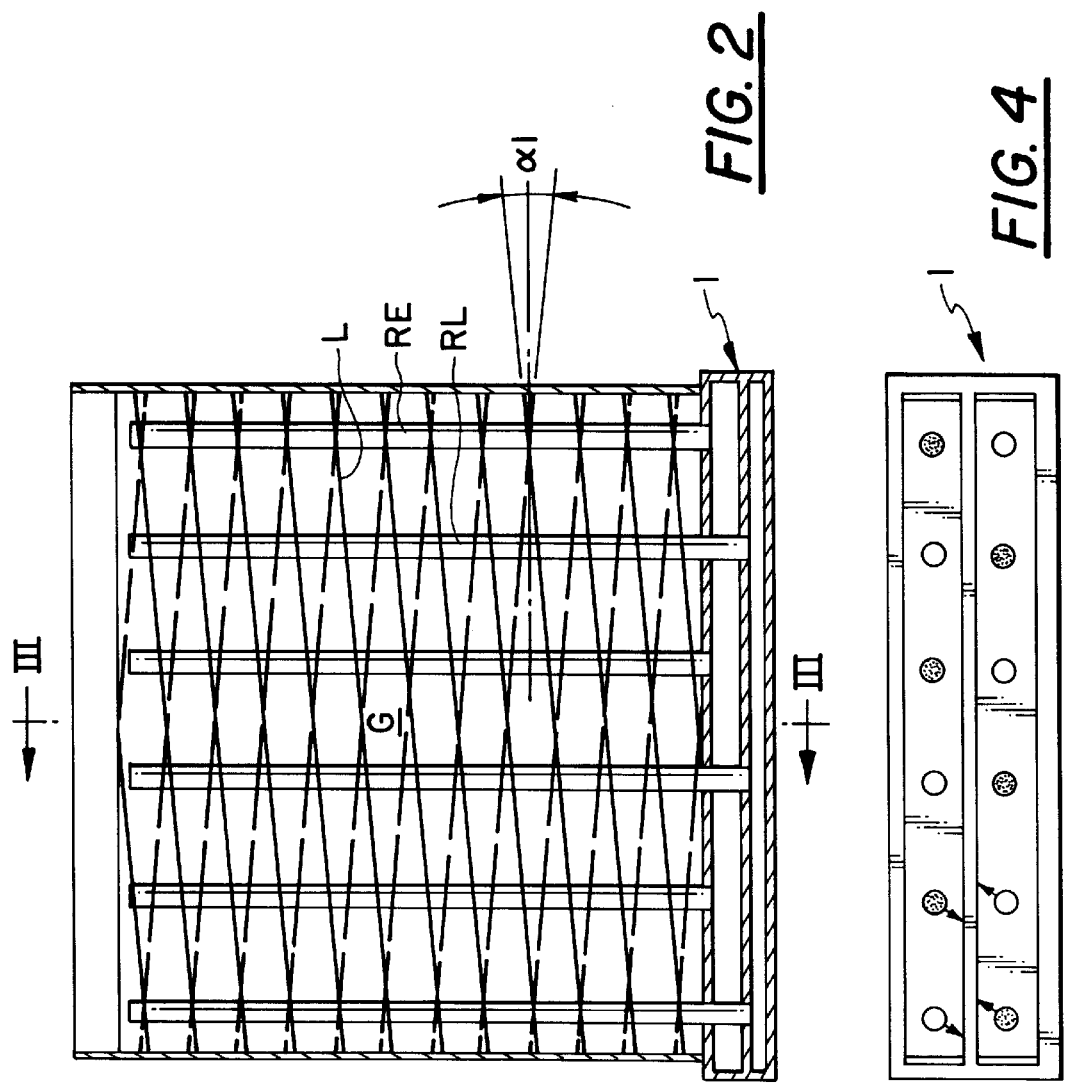
FIG. 2
FIG. 4
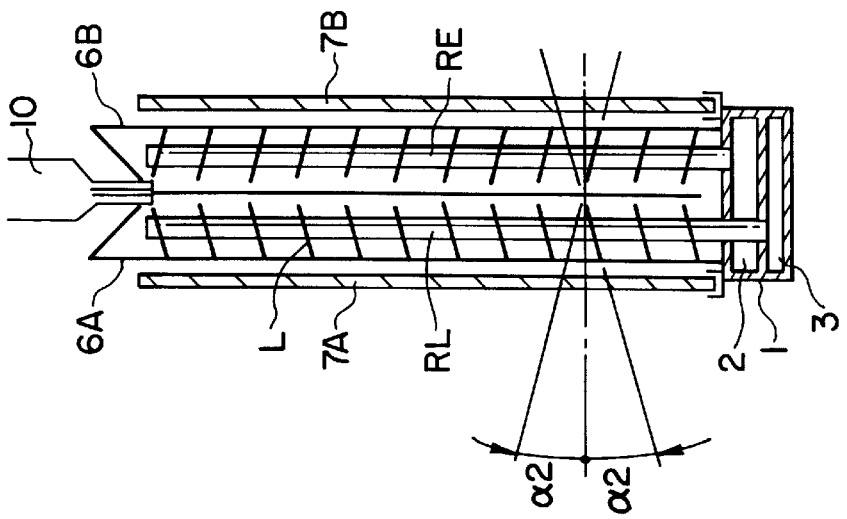
FIG. 3

DEVICE FOR CHEMICAL OR ELECTROYLTIC SURFACE TREATMENT OF PLATE-LIKE OBJECTS

This is a national stage application of PCT/DE96/01938, filed Oct 11, 1996.

BACKGROUND OF THE INVENTION

1. Technical Field

The invention relates to a device comprising a flow cell defining a treatment region that contains a treatment location that extends along a plane for the chemical or electrolytic surface treatment of plate-shaped articles at the treatment location, when a main plane of the articles extends along the plane along which the treatment location extends, with first feed elements in the form of tubes with outlet openings for the directed supply of a process liquid to the treatment region.

The basic aim in connection with surface treatment devices, for example galvanic baths, which are used for coating plate-like articles, for example printed circuit boards, is to achieve an even surface quality, for example a good distribution of the layer density over the total surface of the plate to be coated. In the case of printed circuit boards the drilled holes are particularly critical, whose interior walls should also possibly be provided with a layer density which should come as close as possible to the average copper layer density in the area of the surface.

2. Prior Art

A further aim generally is to intensify and accelerate the effects of the electrolytical or chemical processes, i.e. the deposition in a galvanic bath, as a whole, wherein it is part of the prior art in connection with galvanic baths (for example DE 44 05 741) to move the electrolyte past the printed circuit boards to be coated in the galvanic bath by means of suitable pipe arrangements in order to achieve a greater deposition speed. However, with the increasing effect of this principle, the pump outlay for the forced passage of the electrolyte through the galvanic bath is increased to uneconomical sizes. Further than that, the increased pump energy outlay leads to increasing heat development, which shows its effects in an increased heat supply to the galvanic bath, whose removal again requires additional energy outlays.

A further concept for intensifying and accelerating the processes in the galvanic bath which, for example, is used for the coating of printed circuit boards, is known from EP 0 420 640 A1; based on the known effect that a moving electrolyte permits cathode current densities of two to three times those of a non-moving electrolyte, it is proposed there to conduct air bubbles along both sides of the article to be coated, which emerge from a container below the galvanic bath and result in the desired movement effect. However, in the device described there the air bubbles are essentially used for achieving a recirculating effect in the electrolyte liquid in such a way, that the electrolyte liquid rises along the article to be coated and drops down again in the wall areas of the electrolyte container, after which the cycle starts again.

BRIEF SUMMARY OF THE INVENTION

It is the object of the invention to further improve the parameters characterizing the operation of a bath by means of the further development of the guidance of the process liquid used for the surface treatment. In the case of a galvanic bath it is particularly intended to achieve high deposition speeds over short galvanizing distances, the highest possible current densities, the most even possible layer density distribution and a low energy expenditure for the recirculation of the catalyst.

In accordance with the invention this object is attained in a device of the type described at the outset, by the provision of additional, second feed means in the treatment region for the directed introduction of air into the active area of guide elements, which consist of flow gratings (5A, 5B), maintained at a distance on both sides of the treatment location, with small plates (L) arranged in the manner of a shutter, which are inclined upward and downward in the direction parallel with the plane along which the treatment location extends.

The employment of flow gratings in the field of electrolysis technology has already been provided (EP 0 481 576 B1) in order to generate in a diaphragm electrolysis module a forced guidance of the electrolyte movement directly along the diaphragm surface and over the entire diaphragm surface. It is particularly stressed here that because of these guidance gratings the blown-in air can penetrate only a little into the electrolyte interior. The purpose of the guide gratings is to prevent the covering of the diaphragm with interfering reaction products in the electrolyte, for example organic additives. Therefore a direct effect on the electrode is not provided.

The use of flow effects in electrolytic processes is also the subject of DD 285 127 B5, which deals with the design of electrodes which, for electrolytic processes which generate gas, consist of a plurality of electrode elements essentially arranged parallel with each other. Profiles are provided on the electrodes there which are intended to allow the faster removal of the reaction gas, such profiles cause a capillary effect, for example it is possible to provide bar-like profiles on the electrode elements. This concept cannot be transferred to flow cells intended to be used for the surface treatment of plate-shaped articles.

The inventive principle of admixing air in connection with the design of the guide elements as flow gratings causes the emerging air bubbles to attempt, because of their buoyancy, to pass upward along the flow grating as fast as possible and therefore to force the surrounding process liquid along. The ratio between the forced guidance of the process liquid and the optimization of the process parameters and the energy output required for this is decisively improved.

It has been shown that with the positioning in accordance with the invention of the small plates of the flow gratings this measure also has no negative effects on the coating results in a galvanic bath; in spite of electrical shielding effects of the flow gratings, neither the constant layer density on the surface of the material to be galvanized (printed circuit boards) nor the above mentioned layer density distribution in the drill holes of printed circuit boards is diminished, in contrast thereto an improvement of these results is achieved instead because of the introduction of strongly turbulent electrolyte flows by means of the air bubbles.

A particularly preferred employment of the attainment of the object of the invention provides that the bottom of the flow cell, which is embodied as a galvanic cell, is constituted by a two-piece supply tank, whose upper chamber constitutes the electrolyte chamber and whose lower chamber constitutes an air chamber, from which feed tubes are conducted perpendicularly upward into the galvanic bath, which are used for the directed supply of the electrolyte as well as the air, and simultaneously for the correct positional seating of the small plates constituting the two flow gratings. If the top of the supply tank and the separating wall, located under it, between the electrolyte chamber and the air chamber are provided with rows of holes aligned with each other, the appropriate feed tubes can be simply pushed into the supply tank selectively at the intended distance and in their relative position to each other and are fixed in place in this way. It is possible by this to achieve a simple, module-like total structure of the flow cell, which can also be rapidly adapted to changing use requirements.

Further advantageous embodiments can be taken from the dependent claims.

BRIEF DESCRIPTION OF THE SEVERAL VIEWS OF THE DRAWING

A preferred exemplary embodiment of a flow cell in accordance with the invention will now be explained in more detail by means of the drawings, shown are in.

DESCRIPTION OF THE INVENTION

Figure 1:
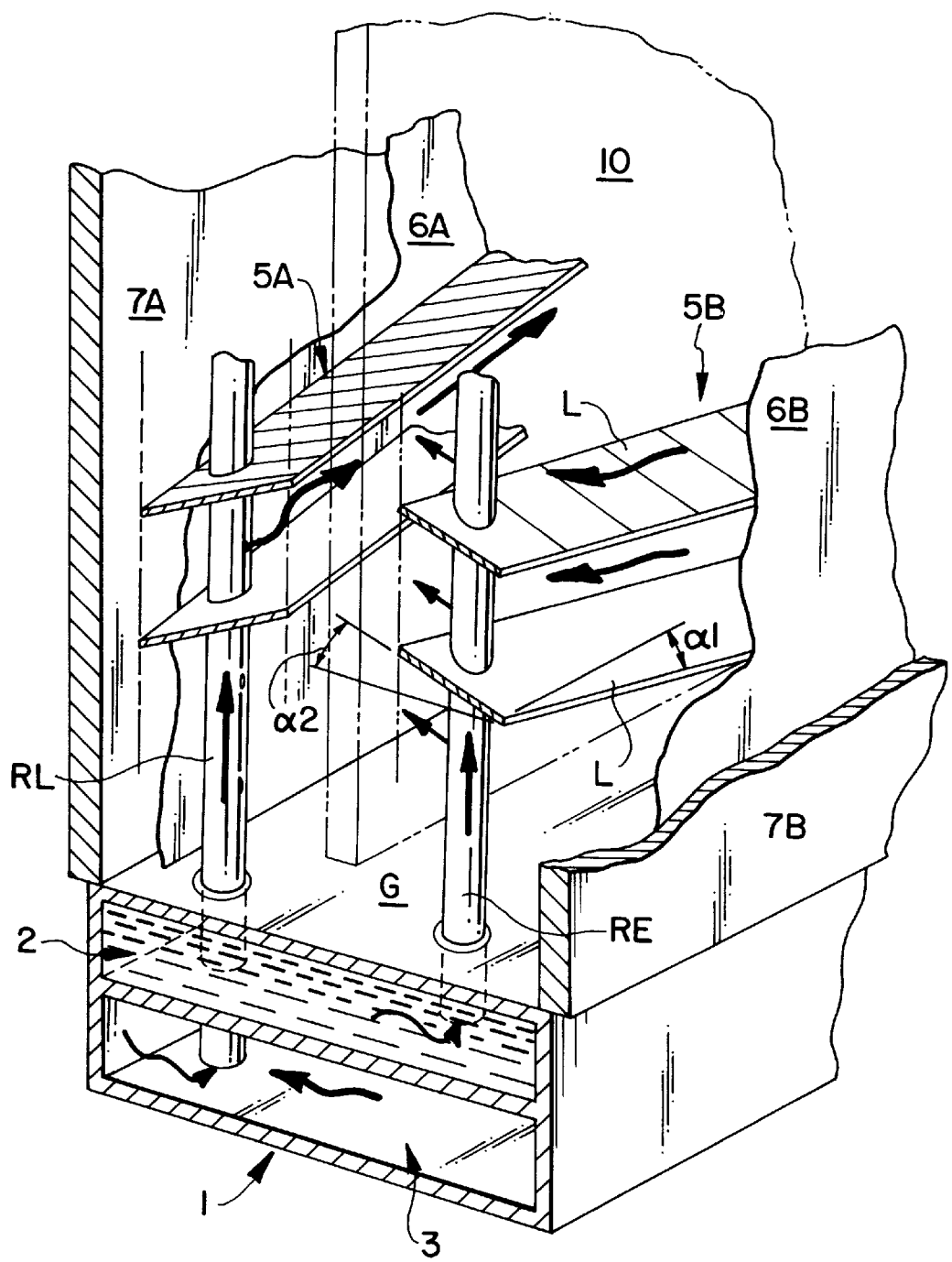
FIG. 1, a partially sectional perspective partial representation of a galvanic bath with the essential elements of the invention, FIG. 2, a schematic longitudinal vertical section through the galvanic bath, FIG. 3, a schematic partial cross section through the galvanic bath along the line III—III in FIG. 2, and FIG. 4, a top view on the supply tank with the openings for the feed tubes.

As is usual, the galvanic bath G is bounded by two vertical lateral walls 7A, 7B and front walls (not represented), defining a flow cell through which, for example by means of suitable lip seals, the material 10 to be galvanized, which is vertically suspended from suitable transport elements, can be introduced into the galvanic bath G and taken out of it again, such as is described in detail in DE 39 29 728 A1, for example, so that it is not necessary here to address the customary elements of such known installations. However, it will be appreciated that the flow cell defines a treatment region which is occupied by the bath and that the treatment region includes a vertically extending treatment location in which the materials 10 to be galvanized will be disposed during the treatment process.

The bottom of the galvanic tank G is formed by a supply tank 1 comprised of two chambers placed one on top of the other; in the upper chamber, the electrolyte chamber 2, the respective electrolyte liquid of the galvanic bath G is contained and is pumped perpendicularly upward via feed tubes RE (only one is represented in FIG. 1), where the electrolyte is pushed outward through outlet openings in the feed tube RE in the direction toward the material 10 to be galvanized by the action of the recirculating pump and in this way flows across the surface of the article to be coated (this movement is symbolized by three arrows, starting at the feed tube RE).

Compressed, oil free blower air is conducted from the air chamber 3 via a plurality of further feed tubes RL, which emerges in the form of air bubbles at the outlet openings of the feed tubes RL into the galvanic bath G. As represented in FIGS. 2 to 4, a plurality of such feed tubes RE, RL has been pushed in parallel rows through suitable openings of the supply tank 1, where they are held, for example by O-rings as seals. In this case the inlet openings of the feed tubes RE terminate in the electrolyte chamber 2, the lower ends of the feed tubes RL have been passed through the separating bottom between the electrolyte chamber 32 and the air chamber 3 and terminate in the air chamber 3.

A preferred embodiment provides to arrange the electrolyte feed tubes RE and the air feed tubes RL alternatingly along the supply tank 1 in such a way that a feed tube RE and a feed tube RL are always located opposite each other (as represented in FIG. 1). The plate-shaped material 10 to be galvanically coated is suspended between the two rows of feed tubes (FIG. 4).

A further important mechanical function of the feed tubes RE, RL consists in the seating of a plurality of small plates L, which are arranged parallel with each other in such a way that a flow grating 5A, 5B is formed on both sides of the material 10 to be galvanically coated by small plates L disposed above each other in the manner of tiers, so that a stand- or frame-like structure is formed on both sides of the material 10 to be galvanically coated, which is used to optimize the electrolyte flow in the area of the material 10 to be galvanically coated, The following steps are provided to this end:

Viewed in the direction of the plane of the material 10 to be galvanized, the small plates L are arranged either rising (flow grating 5A) or falling (flow grating 5B), at the same time they are arranged extending roof-like upward in the direction toward the material 10 to be galvanized. This orientation has the effect that a movement direction is impressed on an air bubble, exiting the feed tube RL and driven by its buoyancy, by the respectively "next above" little plate, which has an essential directional component both in the longitudinal direction of the material 10 to be galvanized and in the direction toward the surface of the material 10 to be galvanized. This has the result that the air bubbles exiting at the flow grating 5A will move in the direction of the arrows indicated there, the air bubbles exiting at the flow grating 5B will move in the opposite direction along the surface of the material 10 to be galvanized because of the different inclination of the small plates L in respect to the horizontal plane. In actual operation this movement of the air bubbles has the result that the electrolyte liquid located in the immediate vicinity of the air bubbles is carried along in this preset direction by the air bubbles so that, speaking graphically, because of frictional effects each air bubble pulls a certain amount of electrolyte liquid with it "upward" and in the direction toward the article to be coated, because of which it is possible to drastically reduce the energy outlay required for the recirculation of the electrolyte by means of the feed tube RE. The air bubbles thus generate a turbulent flow of an electrolyte/ air mixture in the immediate surface area of the material 10 to be galvanically coated, along with the resultant positive effects, such as more rapid deposition of the coating metal, optimization of the layer density constancy, in particular also with holes in printed circuit boards, and short length of galvanization. In this respect the above mentioned relative positioning of the feed tubes RE, RL has a positive effect in that the action of air bubbles on the electrolyte always takes place from only one side of the printed circuit board and it is therefore possible to generate a definite flow through holes or bores in the printed circuit board over wide areas, which positively affects the last mentioned effect (evenness of the layer density).

A particularly advantageous effect in the sense of an optimization of the electrolyte throughput can be achieved if the direction of the outlet openings in the feed tubes RL, RE is directed away in the direction of the rising of the small plates L by approximately 20° to 70° from the vertical plane of the material 10 to be galvanized. An introduction of the air and the electrolyte into the galvanic bath is defined by means of this, which is compatible with the above described movement direction impressed by the arrangement of the small plates L.

The inclination of the small plates L and the selection of the position and exit direction of the outlet openings in the feed tubes, if skillfully matched, generates synergistic effects in individual cases, in that the physical effects caused by these individual measures are superimposed on each other in such a way that their combined effect has a considerably greater consequence than the expected sum of the individual effects of these individual measures.

A particularly advantageous effect is achieved if the small plates L of a flow grating which vertically follow each other are inclined at the same first angle α, and if they are positioned in height in such a way that the higher end point of the respectively lower small plate is at the same height as the lower end point of the respectively upper small plate. In the embodiment sketched in FIG. 1, the small plates of the flow grating 5A are inclined upward (viewed from the drawing plane), the small plates of the flow grating 5B are downward inclined.

Accordingly, the two flow gratings 5A, 5B are positioned in relation to each other in such a way that the horizontal projections of their respective small plates L on the article 10 to be coated do not coincide. The positioning is preferably selected such that intersection points result on half the length of the flow gratings; in FIG. 2 these intersection points of the projections are located in the sectional plane III—III, from which the equal height position of the intersection lines of small plates located opposite from each other represented in FIG. 3 results, in the perspective sectional view in FIG. 1 the front sectional plane also lies in this sectional plane III—III.

The "non-overlapping" arrangement of the small plates has the result that effects of the electrical field in the cathode chamber of the galvanic cell, which in principle cannot be excluded, compensate each other to a large extent, and it is therefore possible to avoid differences in the coating quality as a result of changing field strengths over the surface of the material to be coated.

An alternative to the above described arrangement of the small plates, not shown in the drawings, consists in that the small plates are perpendicularly arranged and are embodied as angled profiles, whose open side points toward the article to be coated. In this case it then is useful to offset these angled profiles in respect to each other horizontally. With this arrangement there is also an "acceleration effect" by the air bubbles exiting from the feed tubes on the surrounding electrolyte possible, if the feed tubes are arranged in the opening area of the angled profiles.

Finally, a practical exemplary embodiment of the galvanic bath in accordance with the invention will be briefly presented:

The two flow gratings form a gap of 10 to 15 mm, in which the printed circuit board 10 is inserted. 5,000 to 25,000 l/h of electrolyte per meter of chamber length are pumped in the electrolyte chamber 2, slightly compressed, oil-free blower air is introduced into the air chamber 3 (the appropriate pumps are not represented in the drawings). Conventional commercial high-quality electrolytes can be used as the electrolyte, a copper electrolyte, for example, which is commercially available under the name "Copper Gleam 125 HS" of the firm Lea Ronal GmbH, can be used for the deposition of copper on printed circuit boards.

The practically usable current strengths lie between 3 and 4 A/dm² at operating temperatures of 28° to 55° Celsius, the value of the current density which can be achieved is essentially predetermined in printed circuit boards by the geometry of the drill holes, with a decreasing length/diameter ratio it is possible to achieve particularly good layer density distribution results even at high current strengths.

The described exemplary embodiment relates to the use of the flow cell as a galvanic bath for the electrolytic coating of printed circuit boards. It is easily understood that the inventive concept includes all other areas of employment wherein the action of a process liquid on surface areas of a product to be treated is the goal.

I claim:

1. A device comprising a flow cell defining a treatment region that contains a treatment location that extends along a plane for the chemical or electrolytic surface treatment of plate-shaped articles at the treatment location, when a main plane of the articles extends along the plane along which the treatment location extends, with first feed elements in the form of tubes with outlet openings for the directed supply of a process liquid to the treatment region, characterized by additional, second feed means in the treatment region for the directed introduction of air into the active area of guide elements, which consist of flow gratings (5A, 5B), maintained at a distance on both sides of the treatment location, with small plates (L) arranged in the manner of a shutter, which are inclined upward and downward in the direction parallel with the plan along which the treatment location extends.

2. The device in accordance with claim 1, characterized in that the first angle (α1), by which the small plates (L) are inclined upward or downward, lies between 3° and 15°.

3. The device in accordance with claim 1, characterized in that the small plates (L) are inclined upward at a second angle (α2) in the direction toward the treatment location.

4. The device in accordance with claim 3, characterized in that the second angle (α2) lies between 10° and 60°.

5. The device in accordance with claim 1, characterized in that the small plates (L) essentially extend vertically and are embodied as angled profiles, whose open side points toward the treatment location.

6. The device in accordance with claim 5, characterized in that the opening angle of the profile lies at 60° to 120°.

7. The device in accordance with claim 1, characterized in that small plates (L) of the same flow grating (5A, 5B) which follow each other vertically are inclined at the same first angle (α) either upward or downward, and that in respect to height they are positioned in such a way that the highest end point of the respectively lower small plate is at the same height as the lowest end point of the respectively upper small plate.

8. The device in accordance with claim 7, characterized in that the two flow gratings (5A, 5B) are vertically offset from each other in such a way that the horizontal projection of their respective small plates (L) on the treatment location results in intersection points at half the length of the flow gratings.

9. The device in accordance with claim 1, characterized in that the first and second feed elements consist of feed tubes (RE, RL), which are conducted at a distance from each other through the small plates (L) and are held, and whose outlet openings point in the rising direction of the small plates (L).

10. The device in accordance with claim 9, characterized in that the feed tubes (RE, RL) are supplied from a process liquid chamber (2) and an air chamber (3), into which their respective inlet openings have been placed.

11. The device in accordance with claim 10, characterized in that the feed tubes (RE, RL) are held by means of seal rings in rows of holes of their associated chambers.

12. The device in accordance with claim 10, further comprising a common supply tank (1) having a process liquid chamber (2) for supplying the process liquid and an air chamber (3) for supplying the air, said process liquid chamber and said air chamber being arranged one above the other and being located at the bottom of the flow cell (G).

13. The device in accordance with claim 1, further comprising a common supply tank (1) having a process liquid chamber (2) for supplying the process liquid and an air chamber (3) for supplying the air, said process liquid chamber and said air chamber being arranged one above the other and being located at the bottom of the flow cell (G).

14. The device in accordance with claim 1, characterized in that on their side facing away from the treatment location, the two flow gratings (5A, 5B) abut on a vertically held acid-proof textile cloth (6A, 6B), which is located in front of the lateral walls (7A, 7B) of the flow cell.

* * * * *